(12) United States Patent
Ullmann

(10) Patent No.: US 7,275,434 B2
(45) Date of Patent: Oct. 2, 2007

(54) MICROMECHANICAL COMPONENT

(75) Inventor: Dirk Ullmann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/523,187

(22) PCT Filed: Feb. 25, 2003

(86) PCT No.: PCT/DE03/00591

§ 371 (c)(1),
(2), (4) Date: Sep. 6, 2005

(87) PCT Pub. No.: WO2004/019048

PCT Pub. Date: Mar. 4, 2004

(65) Prior Publication Data

US 2006/0107743 A1   May 25, 2006

(30) Foreign Application Priority Data

Aug. 2, 2002   (DE) ................. 102 35 370

(51) Int. Cl.
*G01P 15/00* (2006.01)
(52) U.S. Cl. ................. 73/514.29; 73/504.15
(58) Field of Classification Search ............ 73/514.29, 73/514.16, 514.38, 504.15, 504.12, 514.36
See application file for complete search history.

(56) References Cited

U.S. PATENT DOCUMENTS 4,244,225 A * 1/1981 Greenwood ............... 73/514.29
4,479,385 A * 10/1984 Koehler .................... 73/514.29
5,079,958 A * 1/1992 Takase et al. ........... 73/862.625
5,140,155 A   8/1992 Carome
6,005,275 A * 12/1999 Shinogi et al. ............. 257/417
6,084,257 A * 7/2000 Petersen et al. ............ 257/254
6,311,556 B1 * 11/2001 Lefort et al. .............. 73/514.29
6,564,637 B1 * 5/2003 Schalk et al. ............. 73/504.12

FOREIGN PATENT DOCUMENTS

| DE | 198 25 298 | 12/1999 |
|----|-----------|---------|
| DE | 100 12 960 | 9/2001 |
| JP | 09 127151 | 5/1997 |

OTHER PUBLICATIONS

Patent Abstracts of Japan, vol. 1997, No. 09, Sep. 30, 1997.

* cited by examiner

*Primary Examiner*—Helen Kwok
(74) *Attorney, Agent, or Firm*—Kenyon & Kenyon LLP

(57) ABSTRACT

In order to implement two different sensitivities simultaneously in one component, in particular in an acceleration sensor having a substrate, at least one spring device, and at least one seismic mass, it is proposed that the spring device be designed for an intrinsically nonlinear behavior corresponding to a progressive spring characteristic curve, in which a greater acceleration is associated at least locally with a greater rigidity (spring constant).

6 Claims, 1 Drawing Sheet

MICROMECHANICAL COMPONENT

FIELD OF THE INVENTION

The present invention relates to a micromechanical component, in particular an acceleration sensor, having a substrate, at least one spring device, and at least one seismic mass, the spring device being connected at a first end to the substrate and at a second end to the mass, and the rigidity (spring constant) of the spring device being designed so that a motion of the mass relative to the substrate is causable as a result of an acceleration relative to the substrate, in particular parallel to a surface of the substrate.

BACKGROUND INFORMATION

A micromechanical component of this type is described in German Patent Application No. DE 100 12 960.

Although applicable to any micromechanical components and structures, in particular sensors and actuators, the present invention and the problem on which it is based are explained with reference to a micromechanical acceleration sensor producible using the technology of silicon surface micromechanics (SMM).

Acceleration sensors, and in particular micromechanical acceleration sensors using the technology of surface or bulk micromechanics, are gaining increasingly large market shares in the motor vehicle equipment sector and, to an increasing extent, are replacing the hitherto usual piezoelectric acceleration sensors.

The conventional micromechanical acceleration sensors usually function in such a way that the resiliently mounted seismic mass device, which can be deflected in at least one direction by an external acceleration, brings about, upon deflection, a capacitance change in a differential capacitor device connected thereto, that change being a measure of the acceleration. A differential capacitor device having a comb structure, parallel to the surface of the substrate, made up of moving and fixed electrodes is described in the above-identified German patent application. The deflection can also be detected on the basis of a different suitable measurement method.

The sensitivity of such conventional micromechanical acceleration sensors for the measured variable (acceleration) can, at present, be adjusted substantially only by way of the rigidity of the spring mounting of the seismic mass, i.e., by way of its spring constant that must be selected beforehand. A high sensitivity in this context means, however, that the linear return forces of the springs are small, so that because of its correspondingly low load capacity, the component is usable only as a low-G sensor. For acceleration sensors that are to be used in a range with a higher maximum acceleration, for example 50 G (G=acceleration of Earth's gravity) or 100 G, the spring device must therefore be designed from the outset with a higher rigidity (spring constant).

Because of the linear correlation between acceleration and deflection, however, with a "hard" spring of this kind a large acceleration corresponds to a small deflection, and therefore also to a lower sensitivity of the acceleration sensor. For practical application, a demand exists for sensors that simultaneously exhibit a high resolution in the lower measurement range and a large measurement range, i.e., one extending up to large maximum accelerations; until now, however, the user has had either to decide on a specific range category or sensitivity category or—as a complex alternative—to use several sensors of different range categories simultaneously.

The need to select G-range categories beforehand also creates the manufacturing-related disadvantage that different layouts are necessary for each different G-range category. The aforementioned German patent application therefore proposes an acceleration sensor of the kind in which the spring rigidity is still externally adjustable even after manufacture (upon initial or final measurement), so that a single layout or design can be used for a wide range of rigidities. For that purpose, parts of the spring device are embodied in unlockable and lockable fashion, so that a desired effective spring constant can be set, in particular, by the action of a measurement current or an externally controllable magnetic field on a separation region. Once adjustments have been made they can, at most, be modified by way of another external adjustment procedure.

SUMMARY

It is an object of the present invention to provide a micromechanical component of the type described above that, without requiring external influence, simultaneously exhibits a high resolution in the lower measurement range and a large measurement range, i.e., one extending up to large maximum accelerations.

This object may be achieved, according to the present invention, in that the spring device is designed for an intrinsically nonlinear behavior corresponding to a progressive spring characteristic curve in which a greater acceleration is associated at least locally with a greater rigidity (spring constant), so that the component having this nonlinear spring device exhibits, at least locally, a lesser sensitivity at greater acceleration.

The nonlinear component, with its degressive sensor characteristic curve (corresponding to the progressive characteristic curve of its spring device), furnishes a sensitivity that decreases at least locally, or even continuously, over the acceleration measurement range. Leaving aside the different sensitivity, according to the present invention, the function of two different G-range category sensors can thus be covered with a single nonlinear component.

According to a preferred refinement, the spring device is constituted by two flexural spring elements which are arranged in such a way that the movability of the first flexural spring element with respect to the substrate is restricted but not delimited by an elastic spring stop, the spring stop being constituted by the second flexural spring element itself. With increasing acceleration, the sensitivity of the component thus initially exhibits a constant value corresponding to the spring constant of the first flexural spring element, whereas once the spring stop is reached the sensitivity exhibits—because of the entrainment of the second flexural spring element by the first flexural spring element upon further deflection—a higher value that is once again constant but corresponds to a higher spring constant. In this simple fashion it is possible to implement a component whose sensor characteristic curve is made up of a first linear subregion with a higher slope (sensitivity) and, adjacent thereto with a "kink," a second linear subregion with a lower slope (sensitivity). The intrinsic nonlinearity can thus be implemented, in this case, by way of the self-controlled additive coaction of two spring elements.

According to a further preferred refinement, an (almost) continuously nonlinear behavior can be achieved by the fact that the spring device is constituted by an elongated flexural spring element, disposed transversely to the direction of the acceleration and tapering pyramidally from the first to the second end, whose spring constant increases continuously with bending, so that this intrinsic nonlinearity brings about an approximately logarithmic profile of the component characteristic curve. In this case, the spring element itself already produces nonlinear behavior because of the material used and the geometric configuration.

BRIEF DESCRIPTION OF THE DRAWINGS

Exemplary embodiments of the present invention are explained in further detail in the description below and depicted in the following Figures.

DETAILED DESCRIPTION OF EXAMPLE EMBODIMENTS

Figure 1:
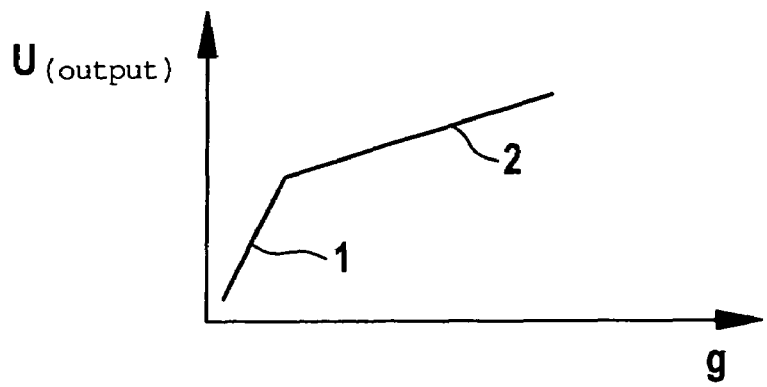
FIG. 1 is a schematic diagram showing the component characteristic curve, with the dependence of the output signal on acceleration, for a component of the example embodiment shown in FIG. 2 and FIG. 3.
Figure 2:
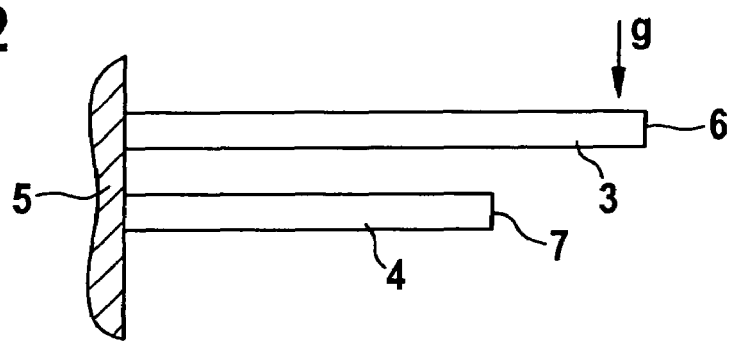
FIGS. 2 and 3 show partial views of two different functional states of an acceleration sensor according to a first embodiment of the present invention.
Figure 3:
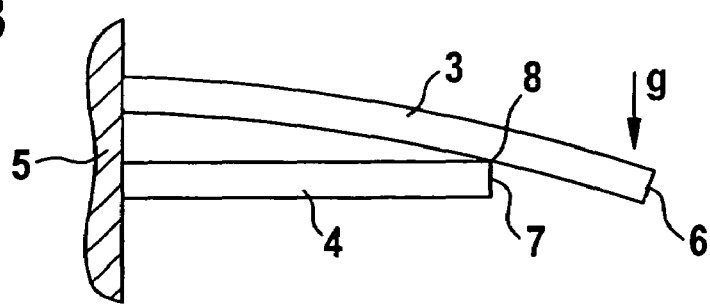

FIG. 1 shows the nonlinear profile of sensor characteristic curve 1 and 2, as is implemented, e.g., by way of the flexural spring elements shown in FIG. 2 and FIG. 3. In this simple instance of a nonlinear characteristic curve, the latter is made up of a first constant subregion 1 with a higher slope and, with a "kink," a second subregion 2 with a slope that is once again constant but less steep, so that the sensor characteristic curve as a whole has a degressive profile.

The relationship between sensor characteristic curve 1 and 2 depicted in FIG. 1 and the spring characteristic curve (not depicted) is that according to Hooke's law, the linear return force of the spring device is directly proportional to the deflection, so that the sensor output signal U (depicted in FIG. 1) measured in accordance with the deflection of the mass depends on the reciprocal of the spring constant. The greater slope of characteristic curve 1 in the lower measurement range, i.e., at small acceleration values g, thus corresponds to a high sensitivity of the micromechanical component and to a "soft" spring, i.e., a spring with low rigidity or a low spring constant. Conversely, the lower sensitivity (although once again constant over that subregion) of the acceleration sensor in second subregion 2 of the sensor characteristic curve, i.e., at large acceleration values g, corresponds to a "hard" spring, i.e., a spring with greater rigidity or a greater spring constant.

FIG. 2 shows that flexural spring elements 3 and 4 according to the first embodiment of the invention each have an elongated shape and are anchored at their respective first ends on component substrate 5. The direction in which acceleration g acts (parallel to the surface of substrate 5) is indicated in FIGS. 2 and 3 respectively by an arrow. Flexural spring elements 3 and 4 are disposed, parallel to one another, transversely (in particular, perpendicularly) to the direction of acceleration g; second end 6, connected to the mass, of first flexural spring element 3, projects beyond second end 7, connectable indirectly to the mass (not depicted) by way of first flexural spring element 3 that is coming to a stop, of second flexural spring element 4.

When, as indicated in the functional state shown in FIG. 3, an acceleration of the mass causes a bending of first flexural spring element 3 as far as second flexural spring element 4, the surface of first flexural spring element 3 facing toward second flexural spring element 4 comes to a stop 8 against second end 7 of second flexural spring element 4. Upon further acceleration and deformation of first flexural spring element 3, the latter entrains second flexural spring element 4 upon further bending, the additional spring constant of second flexural spring element 4 coming into play. Requirements in terms of the type of nonlinear bending behavior can be met over a relatively wide range by selecting, in particular, the length (and thus the rigidity) of flexural spring elements 3 and 4, the length of the "projection" of the first flexural spring element beyond the second, and their distance from one another.

Figure 4:
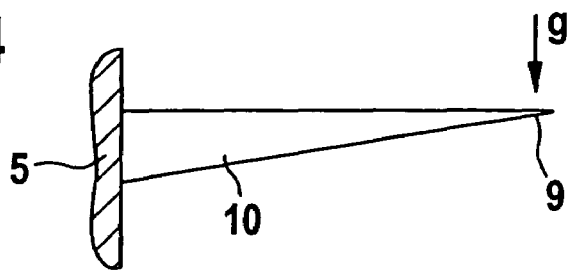
FIG. 4 shows, in the same view as FIGS. 2 and 3, an acceleration sensor according to a second embodiment of the present invention.

FIG. 4 shows a second embodiment of the present invention according to which the spring device is constituted by an elongated flexural spring element 10, disposed transversely to the direction of acceleration g and tapering pyramidally from the first to second end 9, in which, because of the conformation, it is to be expected that its spring constant will increase continuously with bending, so that this intrinsic nonlinearity brings about an approximately logarithmic profile of the component characteristic curve.

The underlying conventional process sequence of the technology of surface micromechanics for the manufacture of acceleration sensors is based on patterning, in particular, the seismic mass and the spring device by etching, typically in epitaxial polysilicon by way of a sacrificial oxide layer. The free and movable component constituents are then detached by selective isotropic etching of the sacrificial layer using a suitable method. The spring devices for the component according to the present invention can readily be manufactured in this existing context.

Although the present invention has been described above with reference to preferred exemplary embodiments, it is not limited thereto but rather is modifiable in many ways. It can be used, for example, in the context of an acceleration sensor in which, as described in German Patent Application No. DE 199 59 707, the inertial mass is elastically deflectable out of its rest position about a rotation axis located perpendicular to the substrate surface and about at least one rotation axis located parallel to the substrate surface. Likewise possible is use in an acceleration sensor in which two different masses are deflectable in rocker fashion perpendicular to the substrate surface, suspension being accomplished by way of a torsional spring.

What is claimed is:

1. A micromechanical component, comprising:
   a substrate;
   at least one spring device; and
   at least one seismic mass, the spring device being connected at a first end to the substrate and at a second end to the mass, and a spring constant of the spring device being configured so that a motion of the mass relative to the substrate is causable as a result of an acceleration relative to the substrate, a direction of the acceleration being parallel to a surface of the substrate;
   wherein the spring device is designed for an intrinsically nonlinear behavior corresponding to a progressive spring characteristic curve, in which a greater acceleration is associated at least locally with a greater spring constant, so that the component exhibits, at least locally, a lesser sensitivity at greater acceleration.

2. The micromechanical component as recited in claim 1, wherein the spring device includes two flexural spring elements arranged so that a movability of a first one of the flexural spring elements with respect to the substrate is restricted but not delimited by an elastic spring stop, the spring stop comprising the second one of the flexural spring elements, so that with increasing acceleration, the sensitivity of the component initially exhibits a constant value corresponding to a spring constant of the first one of the flexural spring elements, whereas once the spring stop is reached the sensitivity exhibits, due to an entrainment of the second one of the flexural spring elements by the first one of the flexural spring elements upon further deflection, one of the higher value that is constant but corresponds to a higher spring constant.

3. The micromechanical component as recited in claim 2, wherein the flexural spring elements each have an elongated shape, the flexural spring elements are disposed parallel to one another transversely to the direction of the acceleration, a second end of the first one of the flexural spring elements being connected to the mass and projecting beyond a second end of the second one of the flexural spring elements, the second end of the first one of the flexural spring elements being connectable indirectly to the mass by way of the first flexural spring element, and, as a result of a bending caused by the acceleration of the mass, of the first flexural spring element as far as the second flexural spring element, a surface of the first flexural spring element facing toward the second flexural spring element is configured to come to a stop against the second end of the second flexural spring element.

4. The micromechanical component as recited in claim 1, wherein the spring device includes an elongated flexural spring element, disposed transversely to the direction of the acceleration and decreasing in thickness from the first end to the second end, the spring device having a spring constant that increases with bending.

5. The micromechanical component as recited in claim 4, wherein a thickness of the spring device decreases pyramidally.

6. The micromechanical component as recited in claim 5, wherein a component characteristic curve of the spring device has an approximately logarithmic profile.

* * * * *